US008278658B2

United States Patent
Okai et al.

(10) Patent No.: US 8,278,658 B2
(45) Date of Patent: Oct. 2, 2012

(54) ELECTRICALLY CONNECTED GRAPHENE-METAL ELECTRODE DEVICE, AND ELECTRONIC DEVICE, ELECTRONIC INTEGRATED CIRCUIT AND ELECTRO-OPTICAL INTEGRATED CIRCUIT USING SAME

(75) Inventors: Makoto Okai, Tokorozawa (JP); Motoyuki Hirooka, Kumagaya (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 12/766,960

(22) Filed: Apr. 26, 2010

(65) Prior Publication Data

US 2010/0270512 A1    Oct. 28, 2010

(30) Foreign Application Priority Data

Apr. 27, 2009    (JP) .................. 2009-107259

(51) Int. Cl.
*H01L 29/40* (2006.01)
*H01B 1/02* (2006.01)
(52) U.S. Cl. .......... 257/44; 257/624; 252/500; 252/503; 252/519.1; 977/734
(58) Field of Classification Search ............ 257/44, 257/624; 252/500, 503, 519.1; 977/734
See application file for complete search history.

(56) References Cited

U.S. PATENT DOCUMENTS

2009/0029221 A1*    1/2009    Goddard et al. .................. 429/30
2010/0285972 A1*    11/2010    Dubrow et al. ................... 506/7

OTHER PUBLICATIONS

Jeong-O Lee et al.; Formation of low-resistance ohmic contacts between carbon nanotube and metal electrodes by a rapid thermal annealing method, J. Phys. D: Appl. Phys. 33 (2000), pp. 1953-1956.

* cited by examiner

*Primary Examiner* — Thanh V Pham
(74) *Attorney, Agent, or Firm* — Antonelli, Terry, Stout & Kraus, LLP.

(57) ABSTRACT

An device according to the present invention comprises: graphene; and a metal electrode, the metal electrode and the graphene being electrically connected, the following relationship of Eq. (1) being satisfied:

$$\coth\left(\sqrt{\frac{r_{GP}}{r_C}}\,S\right) < 1.3, \quad \text{Eq. (1)}$$

where $r_{GP}$ (in units of $\Omega/\mu m^2$) denotes the electrical resistance of a graphene layer per unit area, $r_C$ (in units of $\Omega \mu m^2$) denotes the contact resistance per unit area between the graphene layer and a metal electrode, and S denotes the contact area (in units of $\mu m^2$) between the graphene layer and the metal electrode.

7 Claims, 2 Drawing Sheets

ELECTRICALLY CONNECTED GRAPHENE-METAL ELECTRODE DEVICE, AND ELECTRONIC DEVICE, ELECTRONIC INTEGRATED CIRCUIT AND ELECTRO-OPTICAL INTEGRATED CIRCUIT USING SAME

CLAIM OF PRIORITY

The present application claims priority from Japanese patent application serial no. 2009-107259 filed on Apr. 27, 2009, the content of which is hereby incorporated by reference into this application.

BACKGROUND OF THE INVENTION

1. Field of the Invention

The present invention relates to electrically connected graphene-metal electrode devices having graphenes and metal electrodes connected to one another, and electronic devices, electronic integrated circuits and electro-optical integrated circuits using such electrically connected graphene-metal electrode devices.

2. Description of Related Art

Graphenes (also called graphene sheets) are a sheet of six-membered rings which does not form a closed surface, and are formed by connecting numerous benzene rings two-dimensionally. Carbon nanotubes are formed by rolling up a graphene sheet into a tubular structure. Graphites are formed by stacking multiple graphene sheets. Each carbon atom in a graphene sheet has an $sp^2$ hybrid orbital, and delocalized electrons are present at opposite surfaces of a graphene sheet.

The following typical physical properties of graphenes have been reported: (a) The carrier mobility is in the order of 200,000 $cm^2$/Vs, which is one order of magnitude higher than those of silicon (Si) crystals and is also higher than those of metals and carbon nanotubes. (b) The 1/f noises of typical nanodevices can be significantly reduced. (c) The refractive index is negative. (d) The surface electrons behave as if they have no mass. Because of these properties, graphenes are identified as a candidate for post-silicon electronic materials.

In order to realize graphene based electronic devices and electro-optical integrated circuits, it is essential to connect graphene layers and metal electrodes to one another electrically well (e.g., with low electrical resistance). Nonpatent Document 1 reports contact resistance between a carbon nanotube and a metal electrode. The contact resistance described in the above report is in fact the parallel resistance of the electrical resistance of the carbon nanotube itself and the contact resistance between the carbon nanotube and the metal electrode. (As used herein, the term "contact resistance" includes such parallel resistance as described in the above report.) According to Nonpatent Document 1, the contact resistance between the carbon nanotube and the metal electrode is in the order of a magnitude of kΩ (0.5 to 50 kΩ at room temperature).

Nonpatent Document 1: Jeong-O Lee, C Park, Ju-Jin Kim, Jinhee Kim, Jong Wan Park, and Kyung-Hwa Yoo: "Formation of low-resistance ohmic contacts between carbon nanotube and metal electrodes by a rapid thermal annealing method", J. Phys. D: Appl. Phys. 33, 1953 (2000).

SUMMARY OF THE INVENTION

If a graphene film and a metal electrode are connected in the same manner as described in Nonpatent Document 1, the contact resistance therebetween would similarly be in the order of a magnitude of kΩ. However, such contact resistances of the order of a magnitude of kΩ are too large to realize electronic devices and electro-optical integrated circuits. In view of this problem, it is an objective of the present invention to provide a device having a graphene film and a metal electrode electrically well connected to each other by reducing the contact resistance therebetween.

(I) According to one aspect of the present invention, there is provided a device comprising: graphene; and a metal electrode, the metal electrode and the graphene being electrically connected, the following relationship of equation (Eq.) (1) being satisfied:

$$\coth\left(\sqrt{\frac{r_{GP}}{r_C}}S\right) < 1.3, \quad \text{Eq. (1)}$$

where $r_{GP}$ (in units of $\Omega/\mu m^2$) denotes the electrical resistance of a graphene layer per unit area, $r_C$ (in units of $\Omega\mu m^2$) denotes the contact resistance per unit area between the graphene layer and a metal electrode, and S denotes the contact area (in units of $\mu m^2$) between the graphene layer and the metal electrode.

(II) According to another aspect of the present invention, there is provided an electronic device comprising: graphene; and a metal electrode, the metal electrode and the graphene being electrically connected, the graphene being a material for interconnection, the following relationship of Eq. (1) being satisfied:

$$\coth\left(\sqrt{\frac{r_{GP}}{r_C}}S\right) < 1.3, \quad \text{Eq. (1)}$$

where $r_{GP}$ (in units of $\Omega/\mu m^2$) denotes the electrical resistance of a graphene layer per unit area, $r_C$ (in units of $\Omega\mu m^2$) denotes the contact resistance per unit area between the graphene layer and a metal electrode, and S denotes the contact area (in units of $\mu m^2$) between the graphene layer and the metal electrode.

(III) According to still another aspect of the present invention, there is provided an electronic or electro-optical integrated circuit comprising: graphene; and a metal electrode, the metal electrode and the graphene being electrically connected, the graphene being a material for at least one circuit component selected from the group consisting of channels of field effect transistors, interconnections, optical emitting devices and optical receiving devices, the following relationship of Eq. (1) being satisfied:

$$\coth\left(\sqrt{\frac{r_{GP}}{r_C}}S\right) < 1.3, \quad \text{Eq. (1)}$$

where $r_{GP}$ (in units of $\Omega/\mu m^2$) denotes the electrical resistance of a graphene layer per unit area, $r_C$ (in units of $\Omega m^2$) denotes the contact resistance per unit area between the graphene layer and a metal electrode, and S denotes the contact area (in units of $\mu m^2$) between the graphene layer and the metal electrode.

In the above aspects (I) to (III) of the invention, the following modifications and changes can be made.

(i) The contact area S satisfies the following relationship of Eq. (2), $$\coth\left(\sqrt{\frac{r_{GP}}{r_C}}\,S\right) < 1.1. \qquad \text{Eq. (2)}$$

(ii) The contact area S is 1.0 μm² or more.
(iii) The contact area S is 1.5 μm² or more.
(iv) The graphene consists of single atomic layer or multiple atomic layers.

As used herein, the term "multiple atomic layers" refers to "20 or less atomic layers". In a graphene layer having more than 20 atomic layers, the physical properties (such as electron mobility) are almost the same as those of bulk graphites, and as a result various useful properties inherent to graphene will be lost. More preferably, the graphene of the present invention consists of 10 or less atomic layers.

ADVANTAGES OF THE INVENTION

The invention can sufficiently reduce the contact resistance between graphene and a metal electrode (or the parallel resistance of the electrical resistance of the graphene itself and the contact resistance between the graphene and the metal electrode).

DETAILED DESCRIPTION OF THE PREFERRED EMBODIMENTS

Preferred embodiments of the present invention will be described below with reference to the accompanying drawings. The invention is not limited to the specific embodiments described below, but various combinations of its features are possible within the scope of the invention.

Unlike carbon nanotubes, graphenes are of a planar sheet structure. Therefore, graphenes can form larger contact areas with metal electrodes than carbon nanotubes. Such larger contact areas between graphenes and metal electrodes are anticipated to reduce contact resistances therebetween.

[Discussion on Contact Resistance]

Let $r_{GP}$ (units: Ω/μm²) be the electrical resistance per unit area of a graphene layer itself, $r_C$ (units: Ω·μm²) be the contact resistance per unit area between the graphene layer and a metal electrode, and S (units: μm²) be the contact area between the graphene layer and the metal electrode, then the contact resistance R (units: Ω) between the graphene layer and the metal electrode can be expressed by Eq. (3) below as a function R(S) of S.

$$R(S) = \sqrt{r_{GP} r_C}\,\coth\left(\sqrt{\frac{r_{GP}}{r_C}}\,S\right). \qquad \text{Eq. (3)}$$

Figure 1:
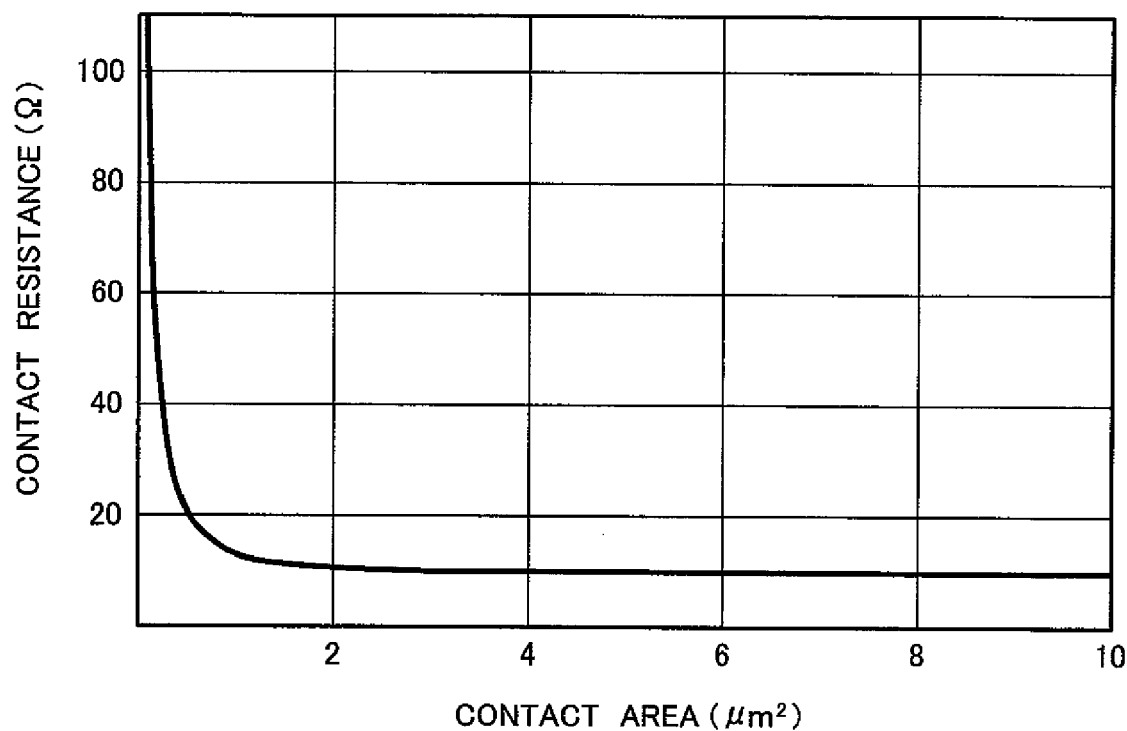
FIG. 1 is a graph of calculation result showing an example relationship between contact area and contact resistance between a graphene film and a metal electrode.

FIG. 1 is a graph of calculation result showing an example relationship between contact area and contact resistance between a graphene film and a metal electrode. FIG. 1 shows the R(S) values calculated for the case where $r_{GP}$=10 Ω/μm² and $r_C$=10 Ω·μm². As shown from Eq. (3) and FIG. 1, the contact resistance R(S) converges to the value of $(r_{GP} \cdot r_C)^{1/2}$ with increasing the contact area S. As described above, contact areas S can be formed comparatively large according to the invention. Therefore, the invention is advantageous in view of contact resistance compared to the technology using a carbon nanotube described in, such as, Nonpatent Document 1.

Furthermore, by satisfying the relationship of Eq. (1) or Eq. (2) below being as the hyperbolic cotangent function term in Eq. (3), the contact resistance R can be suppressed to a level less than the value of $1.3(r_{GP} \cdot r_C)^{1/2}$ or to a level less than the value of $1.1(r_{GP} \cdot r_C)^{1/2}$, respectively.

$$\coth\left(\sqrt{\frac{r_{GP}}{r_C}}\,S\right) < 1.3. \qquad \text{Eq. (1)}$$

$$\coth\left(\sqrt{\frac{r_{GP}}{r_C}}\,S\right) < 1.1. \qquad \text{Eq. (2)}$$

First Embodiment of Present Invention

Figure 2:
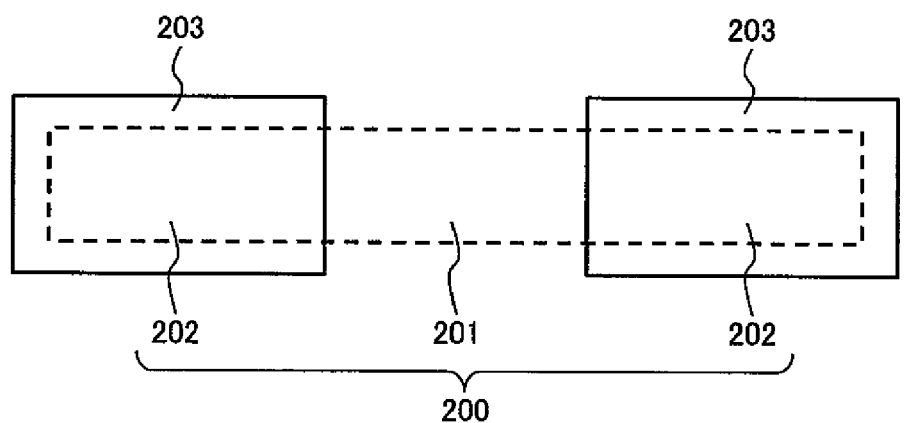
FIG. 2 is a schematic illustration showing a plan view of an exemplary interconnection between metal electrodes according to a first embodiment of the present invention.

A first embodiment of the present invention will be described with reference to FIG. 2. In the first embodiment, a graphene layer is used for interconnection. FIG. 2 is a schematic illustration showing a plan view of an exemplary interconnection between metal electrodes according to a first embodiment of the present invention. As shown in FIG. 2, the graphene layer 200 includes an interconnection portion 201 and contact portions 202 for making electrical contact with metal electrodes 203. The graphene layer 200 is formed on the entire surface of a substrate by chemical vapor deposition and the pattern indicated by the broken line in FIG. 2 is formed by photolithography and dry etching. And then, metal electrodes 203 are formed on the surfaces of the opposite ends of the thus formed graphene layer 200 pattern.

Let $r_{GP}$ (Ω/μm²) be the electrical resistance per unit area of the graphene layer 200 itself and $r_C$ (Ω·μm²) be the contact resistance per unit area between each contact portion 202 and the corresponding metal electrode 203, then the contact area S (μm²) at both contacts should preferably satisfy the following relationship of Eq. (1):

$$\coth\left(\sqrt{\frac{r_{GP}}{r_C}}\,S\right) < 1.3, \qquad \text{Eq. (1)}$$

and should more preferably satisfy the following relationship of Eq. (2):

$$\coth\left(\sqrt{\frac{r_{GP}}{r_C}}\,S\right) < 1.1. \qquad \text{Eq. (2)}$$

For example, by substituting 10 Ω/μm² into $r_{GP}$ and 10 Ωμm² into $r_C$, the following preferable conditions can be obtained. When $r_{GP}$ is 10 Ω/μm² and $r_C$ is 10 Ωm², both contact areas S should be preferably 1.0 μm² or more, and more preferably 1.5 μm² or more.

Under the above calculated preferable conditions for the contact areas S between the contact portions 202 and the metal electrodes 203, the contact resistances R at both contacts can be suppressed to a sufficiently low level. The inventors confirmed the above idea by an actual experiment. Thereby, the two metal electrodes 203 could be electrically connected via the graphene interconnection portion 201 while suppressing the contact resistances R between the metal electrodes 203 and the graphene interconnection portion 201 to a sufficiently low level. Besides, the contact resistances R between the metal electrodes 203 and the graphene interconnection portion 201 were measured using a conventional two-probe or four-probe resistive method.

Second Embodiment of Present Invention

Figure 3:
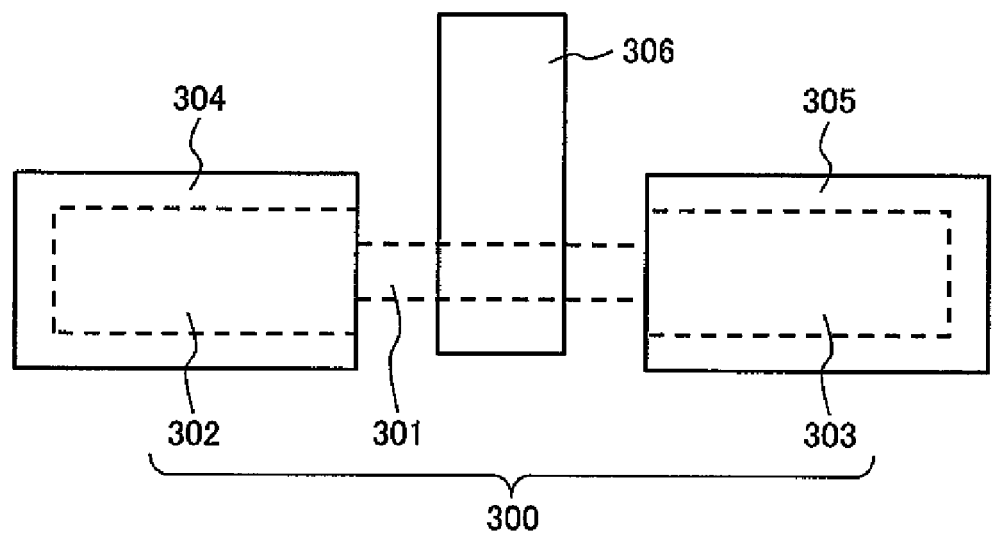
FIG. 3 is a schematic illustration showing a plan view of an exemplary field effect transistor according to a second embodiment of the present invention.

A second embodiment of the present invention will be described with reference to FIG. 3. In the second embodiment, a graphene layer is used for a field effect transistor channel. FIG. 3 is a schematic illustration showing a plan view of an exemplary field effect transistor according to a second embodiment of the present invention. As shown in FIG. 2, the graphene layer 300 includes a graphene channel 301; a contact portion 302 for making electrical contact with a source electrode 304; and a contact portion 303 for making electrical contact with a drain electrode 305. The graphene layer 300 is formed on the entire surface of a substrate by chemical vapor deposition and the pattern indicated by the broken line in FIG. 3 is formed by photolithography and dry etching. And then, the source and drain electrodes 304 and 305 are formed on the surfaces of the opposite ends of the thus formed graphene layer 300 pattern. Finally, a gate dielectric is formed on the graphene channel 301 and then a gate electrode 306 is formed on the gate dielectric.

Let $r_{GP}$ (Ω/μm²) be the electrical resistance per unit area of the graphene layer 300 itself and $r_C$ (Ω²) be the contact resistance per unit area between the source electrode 304 (or the drain electrode 305) and the contact portion 302 (or the contact portion 303), then the contact area S (μm²) at both contacts should preferably satisfy the following relationship of Eq. (1):

$$\coth\left(\sqrt{\frac{r_{GP}}{r_C}}\,S\right) < 1.3, \qquad \text{Eq. (1)}$$

and should more preferably satisfy the following relationship of Eq. (2):

$$\coth\left(\sqrt{\frac{r_{GP}}{r_C}}\,S\right) < 1.1. \qquad \text{Eq. (2)}$$

For example, by substituting 10 Ω/μm² into $r_{GP}$ and 10 Ωμm² into $r_C$, the following preferable conditions can be obtained. When $r_{GP}$ is 10 Ω/μm² and $r_C$ is 10 Ωμm², both contact areas S should be preferably 1.0 μm² or more, and more preferably 1.5 μm² or more.

Under the above calculated preferable conditions for the contact area S between the contact portion 302 and the source electrode 304 and the contact area S between the contact portion 303 and the drain electrode 305, the contact resistances R at both contacts can be suppressed to a sufficiently low level.

Third Embodiment of Present Invention

A third embodiment of the present invention will be described with reference to FIG. 4. In the third embodiment, a graphene layer is used for an optical emitting/receiving device. In graphene optical emitting devices, electrons and holes are injected from the opposite electrodes into the graphene region having a certain band gap, where they combine by direct transition to generate light. Graphene optical receiving devices detect light in the following manner: electrons and holes are generated in the graphene region having a certain band gap by light irradiation, and the thus generated electrons and holes are collected by applying a voltage across the opposite electrodes.

Figure 4:
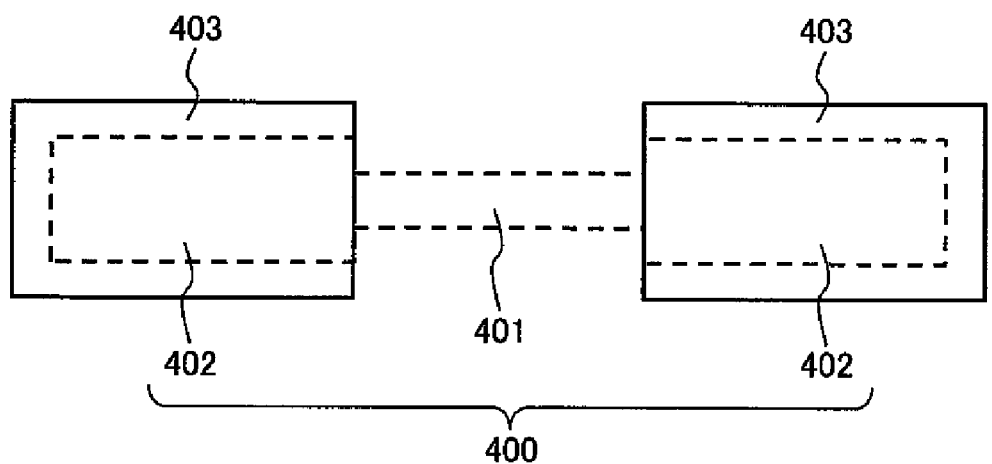
FIG. 4 is a schematic illustration showing a plan view of an exemplary optical emitting/receiving device according to a third embodiment of the present invention.

FIG. 4 is a schematic illustration showing a plan view of an exemplary optical emitting/receiving device according to a third embodiment of the present invention. As shown in FIG. 4, the graphene layer 400 includes the active region 401 of an optical emitting/receiving device; and contact portions 402 for making electrical contact with metal electrodes 403. The graphene layer 400 is formed on the entire surface of a substrate by chemical vapor deposition and the pattern indicated by the broken line in FIG. 4 is formed by photolithography and dry etching. And then, metal electrodes 403 are formed on the surfaces of the opposite ends of the thus formed graphene layer 400 pattern.

Let $r_{GP}$ (Ω/μm²) be the electrical resistance per unit area of the graphene layer 400 itself and $r_C$ (Ωμm²) be the contact resistance per unit area between each contact portion 402 and the corresponding metal electrode 403, then the contact area S (μm²) at both contacts should preferably satisfy the following relationship of Eq. (1):

$$\coth\left(\sqrt{\frac{r_{GP}}{r_C}}\,S\right) < 1.3, \qquad \text{Eq. (1)}$$

and should more preferably satisfy the following relationship of Eq. (2):

$$\coth\left(\sqrt{\frac{r_{GP}}{r_C}}\,S\right) < 1.1. \qquad \text{Eq. (2)}$$

For example, by substituting 10 Ω/μm² into $r_{GP}$ and 10 Ωμm² into $r_C$, the following preferable conditions can be obtained. When $r_{GP}$ is 10 Ω/μm² and $r_C$ is 10 Ωμm², both contact areas S should be preferably 1.0 μm² or more and more preferably 1.5 μm² or more.

Under the above calculated preferable conditions for the contact areas S between the contact portions 402 and the metal electrodes 403, the contact resistances R at both contacts can be suppressed to a sufficiently low level.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A device comprising:
   graphene; and
   a metal electrode, the metal electrode and the graphene being electrically connected, the following relationship of Eq. (1) being satisfied:

$$\coth\left(\sqrt{\frac{r_{GP}}{r_C}}\,S\right) < 1.3, \qquad \text{Eq. (1)}$$

where $r_{GP}$ (in units of $\Omega/\mu m^2$) denotes the electrical resistance per unit area of the graphene, $r_C$ (in units of $\Omega \mu m^2$) denotes the contact resistance per unit area between the graphene and the metal electrode, and S (in units of $\mu m^2$) denotes the contact area between the graphene and the metal electrode.

2. The device according to claim 1, wherein the contact area S satisfies the following relationship of Eq. (2), $$\coth\left(\sqrt{\frac{r_{GP}}{r_C}}\,S\right) < 1.1. \qquad \text{Eq. (2)}$$

3. The device according to claim 1, wherein the contact area S is 1.0 $\mu m^2$ or more.

4. The device according to claim 1, wherein the contact area S is 1.5 $\mu m^2$ or more.

5. The device according to claim 1, wherein the graphene consists of single atomic layer or multiple atomic layers.

6. An electronic device comprising:
   graphene; and
   a metal electrode, the metal electrode and the graphene being electrically connected, the graphene being a material for interconnection, the following relationship of Eq. (1) being satisfied:

$$\coth\left(\sqrt{\frac{r_{GP}}{r_C}}\,S\right) < 1.3, \qquad \text{Eq. (1)}$$

where $r_{GP}$ (in units of $\Omega/\mu m^2$) denotes the electrical resistance per unit area of the graphene, $r_C$ (in units of $\Omega \mu m^2$) denotes the contact resistance per unit area between the graphene and the metal electrode, and S (in units of $\mu m^2$) denotes the contact area between the graphene and the metal electrode.

7. An electronic or electro-optical integrated circuit comprising:
   graphene; and
   a metal electrode, the metal electrode and the graphene being electrically connected, the graphene being a material for at least one circuit component selected from the group consisting of channels of field effect transistors, interconnections, optical emitting devices and optical receiving devices, the following relationship of Eq. (1) being satisfied:

$$\coth\left(\sqrt{\frac{r_{GP}}{r_C}}\,S\right) < 1.3, \qquad \text{Eq. (1)}$$

where $r_{GP}$ (in units of $\Omega/\mu m^2$) denotes the electrical resistance per unit area of the graphene, $r_C$ (in units of $\Omega \mu m^2$) denotes the contact resistance per unit area between the graphene and the metal electrode, and S (in units of $\mu m^2$) denotes the contact area between the graphene and the metal electrode.

* * * * *